United States Patent
Wu

(10) Patent No.: US 12,283,302 B2
(45) Date of Patent: Apr. 22, 2025

(54) MEMORY CIRCUIT, SIGNAL TRANSMISSION SYSTEM AND SIGNAL TRANSMISSION METHOD

(71) Applicant: NANYA TECHNOLOGY CORPORATION, New Taipei (TW)

(72) Inventor: Shun-Ke Wu, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 230 days.

(21) Appl. No.: 18/151,459

(22) Filed: Jan. 8, 2023

(65) Prior Publication Data

US 2024/0233799 A1     Jul. 11, 2024

(51) Int. Cl.
*G11C 7/10* (2006.01)
*G11C 7/04* (2006.01)
*G11C 11/406* (2006.01)

(52) U.S. Cl.
CPC .......... *G11C 11/40607* (2013.01); *G11C 7/04* (2013.01); *G11C 7/1051* (2013.01); *G11C 7/106* (2013.01); *G11C 7/1078* (2013.01)

(58) Field of Classification Search
CPC ........ G11C 11/40607; G11C 11/40626; G11C 11/4091; G11C 7/04; G11C 7/1051; G11C 7/106; G11C 7/1078; G11C 7/1057
See application file for complete search history.

(56) References Cited

U.S. PATENT DOCUMENTS

| | | | |
|---|---|---|---|
| 7,975,162 B2 * | 7/2011 | Kim | G11C 7/222 365/219 |
| 10,892,006 B1 * | 1/2021 | Penney | G11C 11/4085 |
| 2003/0226053 A1 * | 12/2003 | Khieu | G11C 7/1087 713/401 |
| 2006/0265556 A1 * | 11/2006 | Janzen | G11C 11/4091 365/222 |
| 2007/0201286 A1 * | 8/2007 | Oh | G11C 11/4096 365/194 |
| 2013/0070536 A1 * | 3/2013 | Takai | G11C 7/222 365/189.05 |

(Continued)

FOREIGN PATENT DOCUMENTS

| | | | | |
|---|---|---|---|---|
| CN | 101375255 B | * | 9/2011 | ............... G06F 9/30 |
| JP | 7064633 B1 | * | 5/2022 | |

*Primary Examiner* — Mushfique Siddique
(74) *Attorney, Agent, or Firm* — CKC & Partners Co., LLC

(57) ABSTRACT

A memory circuit comprises a signal buffer, a plurality of switch circuits, a temperature sensor, a path-length-compensation circuit and at least one data latch. The signal buffer is configured to receive a strobe signal. The plurality of switch circuits are coupled to the signal buffer through a plurality of signal paths respectively, wherein the lengths of the plurality of signal paths are equal. The temperature sensor is coupled to the plurality of switch circuits and configured to conduct one of the plurality of switch circuits according to temperature of the memory circuit. The path-length-compensation circuit comprises a plurality of input terminals connected in series, which are configured to respectively receive outputs of the plurality of switch circuits. The at least one data latch is coupled to an output terminal of the path-length-compensation circuit and configured to store or output data according to output of the path-length-compensation circuit.

17 Claims, 3 Drawing Sheets

(56) References Cited

U.S. PATENT DOCUMENTS

| | | | | |
|---|---|---|---|---|
| 2014/0177357 A1* | 6/2014 | Kim | ................... | G11C 7/1087 |
| | | | | 365/189.16 |
| 2015/0063044 A1* | 3/2015 | Byun | ..................... | G11C 7/22 |
| | | | | 327/174 |
| 2017/0270982 A1* | 9/2017 | Song | ................... | G11C 7/1084 |
| 2021/0141747 A1* | 5/2021 | Jeong | ................... | G11C 7/109 |

* cited by examiner

MEMORY CIRCUIT, SIGNAL TRANSMISSION SYSTEM AND SIGNAL TRANSMISSION METHOD

BACKGROUND

Field of Invention

The disclosure is related to the signal transmission of an asymmetrical circuit, especially about a memory circuit, a signal transmission system and a signal transmission method for transmitting asymmetrical circuit signals.

Description of Related Art

In memory devices, a system-on-chip (SoC) transmits data signals and strobe signals to data latches of memory circuit through different transmission paths, so as to read or write data in memory array. However, limited by the structure of the memory array, the lengths of transmission paths of data signals and strobe signals are often different, which leads to an asymmetrical circuit structure.

In order to compensate the difference in the length of the transmission path of the data signals and the strobe signals, in previous method, a SoC is used to train the circuit to adjust the signal transmission delay, so as to synchronize the data signals and the strobe signals. However, since the signal transmission delay of the circuit changes with the temperature of the circuit, every time the temperature changes, it is necessary to re-train the circuit to adjust the signal transmission delay, and frequent training will result in low efficiency of signal transmission.

In another method, an oscillator circuit is set in the memory circuit to simulate the signal transmission delay of the circuit, and then the SoC is used to correct the timing of signal transmission according to the simulation result. Although this method can improve the efficiency of the corrections, frequent simulations performed by the additional oscillator circuit will cause much additional power consumption of the memory circuit, and frequent corrections will also greatly occupy the bandwidth utilization. Therefore, how to reduce the additional power consumption caused by the corrections while maintaining the efficiency of the corrections is one of the subjects in this field.

SUMMARY

A memory circuit is provided in the present disclosure. The memory circuit comprises a signal buffer, a plurality of switch circuits, a temperature sensor, a path-length-compensation circuit and at least one data latch. The signal buffer is configured to receive a strobe signal. The plurality of switch circuits are configured to be coupled to the signal buffer through a plurality of signal paths respectively, wherein the lengths of the plurality of signal paths are equal. The temperature sensor is coupled to the plurality of switch circuits and is configured to conduct one of the plurality of switch circuits according to the temperature of the memory circuit. The path-length-compensation circuit comprises a plurality of input terminals connected in series, wherein the plurality of input terminals are configured to respectively receive the outputs of the plurality of switch circuits. The at least one data latch is coupled to an output terminal of the path-length-compensation circuit and is configured to store or output data according to the output of the path-length-compensation circuit.

A signal transmission system is provided in the present disclosure. The signal transmission system comprises a controller chip and a memory circuit. The controller chip is configured to transmit data signals and a strobe signal. The memory circuit comprises a signal buffer, a plurality of switch circuits, a temperature sensor, a path-length-compensation circuit and at least one data latch. The signal buffer is configured to receive the strobe signal. The plurality of switch circuits are configured to be coupled to the signal buffer through a plurality of signal paths respectively, wherein the lengths of the plurality of signal paths are equal. The temperature sensor is coupled to the plurality of switch circuits and is configured to conduct one of the plurality of switch circuits according to the temperature of the memory circuit. The path-length-compensation circuit comprises a plurality of input terminals connected in series, wherein the plurality of input terminals are configured to respectively receive the outputs of the plurality of switch circuits. The at least one data latch is coupled to an output terminal of the path-length-compensation circuit and is configured to store or output data according to the output of the path-length-compensation circuit.

A signal transmission method suitable for a signal transmission system including a controller chip and a memory circuit is provided in the present disclosure. The signal transmission method comprises: conducting, by a temperature sensor of the memory circuit, one of a plurality of switch circuits of the memory circuit according to the temperature of the memory circuit; transmitting, by the controller chip, a data signal to one of at least one data latch of the memory circuit and a strobe signal to a signal buffer of the memory circuit respectively; receiving, by a path-length-compensation circuit of the memory circuit, the outputs of the plurality of switch circuits; and storing or outputting, by the one of the at least one data latch, data according to the output of the path-length-compensation circuit. Wherein the plurality of switch circuits are coupled to the signal buffer through a plurality of signal paths respectively, the lengths of the plurality of signal paths are equal, the temperature sensor is coupled to the plurality of switch circuits, the path-length-compensation circuit comprises a plurality of input terminals connected in series, the plurality of input terminals are configured to respectively receive the outputs of the plurality of switch circuits, and the at least one data latch is coupled to an output terminal of the path-length-compensation circuit.

With the memory circuit, signal transmission system and signal transmission method disclosed in present disclosure, the bandwidth utilization can be reduced by automatically and periodically correcting the length of the signal transmission path. In addition, since the switch circuits in the memory circuit can be implemented with simple circuits, compared with the previous method which adds an oscillator circuit, it can cause smaller additional power consumption.

It should be understood that both the foregoing general description and the following detailed description are by examples, and are intended to provide further explanation of the disclosure as claimed.

DETAILED DESCRIPTION

Reference will now be made in detail to the present embodiments of the disclosure, examples of which are illustrated in the accompanying drawings.

The term "coupled" or "connected" used throughout the present disclosure may refer to two or more elements physically or electrically contact with each other in direct, or physically or electrically contact with each other in indirect, or two or more elements interact or act on each other. Unless the article is specifically limited in the present disclosure, "a" and "the" can generally refer to one or more. It will be further understood that the terms "comprising", "including", "having" and similar words used herein indicate the features, regions, integers, steps, operations, elements and/or components described therein, but do not exclude one or more other features, regions, integers, steps, operations, elements, components and/or groups thereof.

Figure 1:
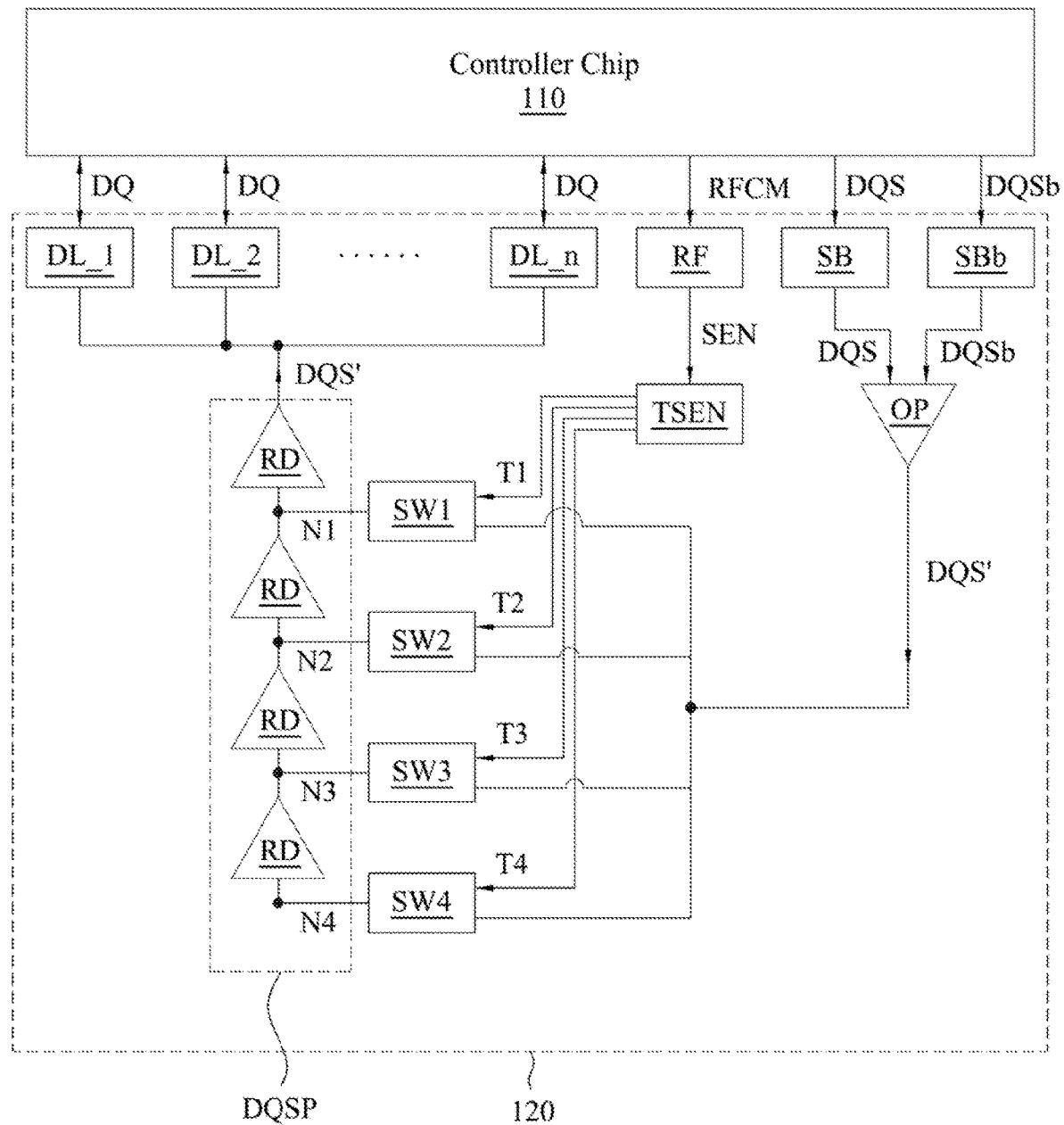
FIG. 1 is a simplified block diagram of a signal transmission system in accordance with some embodiments of the present disclosure.

FIG. 1 is a simplified block diagram of a signal transmission system 100 in accordance with some embodiments of the present disclosure. In some embodiments, the signal transmission system 100 comprises a controller chip 110 and a memory circuit 120. The controller chip 110 is coupled to the memory circuit 120 and configured to transmit a data signal DQ, a strobe signal DQS, an inverted strobe signal DQSb and a refreshing command RFCM to the memory circuit 120, so as to read or write data from the memory circuit 120.

In some embodiments, the controller chip 110 can be implemented with a system-on-chip (SoC) or hardware with similar functions. In some embodiments, the memory circuit 120 can be implemented with a dynamic random access memory (DRAM) or hardware with similar functions.

In some embodiments, the memory circuit 120 comprises a signal buffer SB, an inverted signal buffer SBb, a differential amplifier OP, switch circuits SW1-SW4, a refreshing circuit RF, a temperature sensor TSEN, a path-length-compensation circuit DQSP and data latches DL_1-DL_n, wherein n is a positive integer.

The signal buffer SB is coupled to the controller chip 110 and configured to receive the strobe signal DQS from the controller chip 110. The inverted signal buffer SBb is coupled to the controller chip 110 and configured to receive the inverted strobe signal DQSb from the controller chip 110, wherein the phases of the inverted strobe signal DQSb and the strobe signal DQS are inverted. In other words, when the voltage level of the strobe signal DQS is in a high level (e.g., logic 1), the voltage level of the inverted strobe signal DQSb is in a low level (e.g., logic 0), and vice versa. Two input terminals of the differential amplifier OP are coupled to the signal buffer SB and the inverted signal buffer SBb, and are configured to receive the strobe signal DQS and the inverted strobe signal DQSb and output an amplified strobe signal DQS'.

Compared to simply transmitting the strobe signal DQS to the memory circuit 120, the amplified strobe signal DQS' obtained by combining the strobe signal DQS and the inverted strobe signal DQSb through the differential amplifier OP is stronger (i.e., has bigger amplitude) than the strobe signal DQS, and the influence of noise on the signal quality is also reduced due to the combination of complementary signals (i.e., the strobe signal DQS and the inverted strobe signal DQSb).

The switch circuits SW1-SW4 are coupled to an output terminal of the differential amplifier OP and configured to be conducted or turned off by temperature control signals T1-T4, so as to selectively transmit the amplified strobe signal DQS'. For example, the switch circuit SW1 is conducted when the temperature control signal T1 is in a high level, and is turned off when the temperature control signal T1 is in a low level. In some embodiments, the switch circuits SW1-SW4 can be implemented with metal oxide semiconductor (MOS) circuits and have similar circuit structures.

It should be noted that, in order to explain the connection relationship of the components in the memory circuit 120, the lengths of the paths between the signal buffer SB and the switch circuit SW1-SW4 shown in FIG. 1 are not all equal, but the present disclosure is not limited thereto. In some embodiments, the lengths of the paths between the signal buffer SB and the switch circuits SW1-SW4 are equal to each other.

The refreshing circuit RF is coupled between the controller chip 110 and the temperature sensor TSEN, and is configured to generate a sensing command SEN to instruct the temperature sensor TSEN to sense the temperature of the memory circuit 120. The temperature sensor TSEN is coupled between the refreshing circuit RF and the switch circuits SW1-SW4, and is configured to sense the temperature of the memory circuit 120 when receiving the sensing command SEN, and generate the temperature control signals T1-T4 according to the temperature of the memory circuit 120, so as to conduct one of the switch circuits SW1-SW4 and turn off the other three.

In some embodiments, the refreshing circuit RF generates the sensing command SEN to the temperature sensor TSEN in response to receiving a refreshing command RFCM from the controller chip 110. In practice, whenever a refreshing period RT is expired, the controller chip 110 transmits the refreshing command RFCM to the refreshing circuit RF, and the refreshing circuit RF generates the sensing command SEN to the temperature sensor TSEN for periodic temperature sensing in response to receiving the refreshing command RFCM. In some embodiments, when the signal transmission system 100 changes from the disabled state to the enabled state (i.e., power on), the controller chip 110 transmits the refreshing command RFCM to the refreshing circuit RF.

Figure 2:
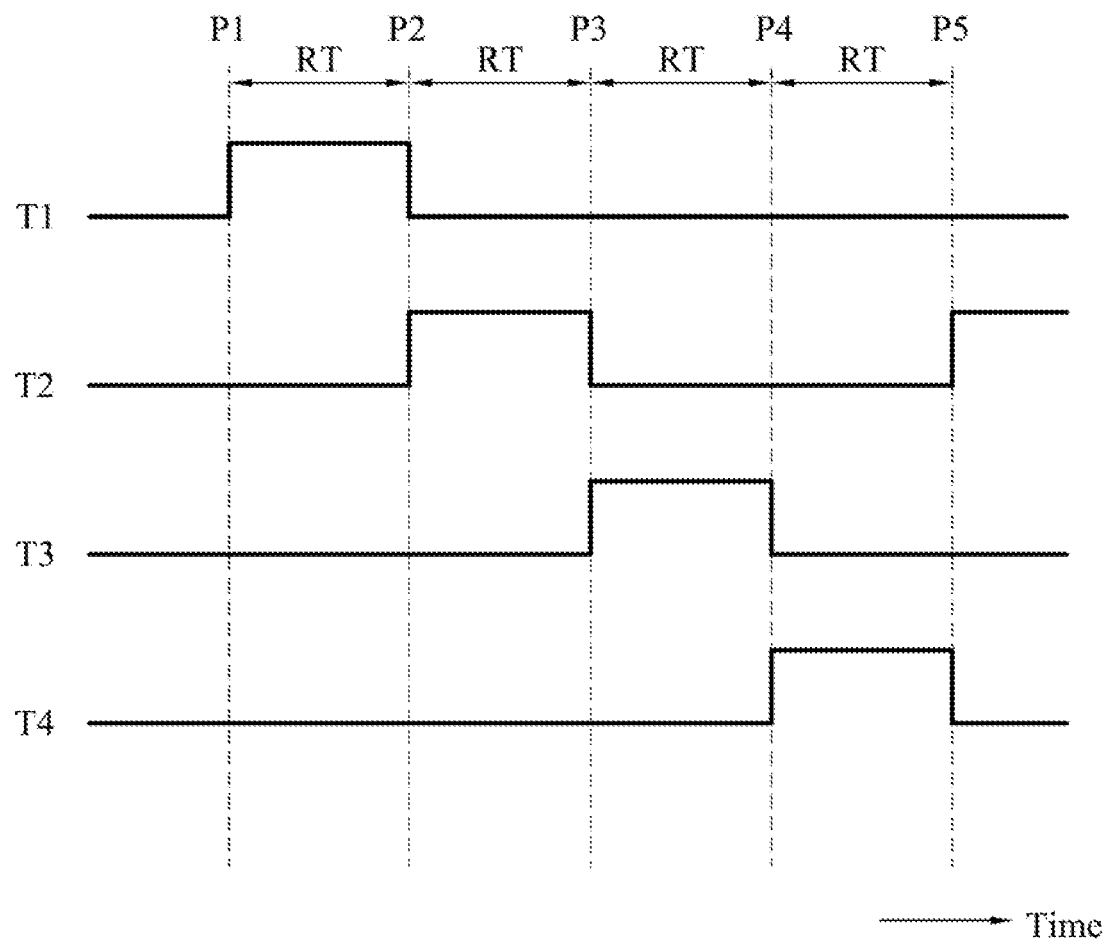
FIG. 2 is a timing diagram of temperature control signals in accordance with some embodiments of the present disclosure.

Please refer to FIG. 2. FIG. 2 is a timing diagram of temperature control signals T1-T4 in accordance with some embodiments of the present disclosure. At time P1, the refreshing circuit RF generates the sensing command SEN to the temperature sensor TSEN when receiving the refreshing command RFCM. The temperature sensor TSEN switches the temperature control signal T1 to a high level according to the temperature of the memory circuit 120, and keeps the temperature control signals T2-T4 in a low level, so that the switch circuit SW1 is conducted, and the switch circuits SW2-SW4 are turned off. Next, whenever a refreshing period RT is expired (that is, in time P2-P5), the controller chip 110 transmits the refreshing command RFCM to the refreshing circuit RF, and the refreshing circuit RF generates the sensing command SEN to the temperature sensor TSEN to make the temperature sensor TSEN switch one of the temperature control signals T1-T4 to a high level according to the temperature of the memory circuit 120, and keep the other three in a low level, so that one of the switch circuits SW1-SW4 is conducted, and the other three are turned off.

Please refer to FIG. 1 again, input terminals N1-N4 of the path-length-compensation circuit DQSP are respectively coupled to the switch circuits SW1-SW4 and configured to receive the outputs of the switch circuits SW1-SW4, and the output terminal N0 of the path-length-compensation circuit DQSP is coupled to the data latches DL_1-DL_n and configured to transmit the output of the path-length-compensation circuit DQSP to the data latches DL_1-DL_n.

The data latches DL_1-DL_n are respectively coupled between the controller chip 110 and the output terminal N0, and configured to receive the data signal DQ from the controller chip 110 through at least one data path (not shown in FIG. 1) respectively and receive the output of the path-length-compensation circuit DQSP. In the embodiment of FIG. 1, the output of the path-length-compensation circuit DQSP is the amplified strobe signal DQS'.

In practice, since the temperature sensor TSEN conducts one of the switch circuits SW1-SW4 with the temperature control signal T1-T4, the amplified strobe signal DQS' is transmitted to the output terminal N0 through the one of the switch circuits SW1-SW4, and then transmitted to the data latches DL_1-DL_n.

It is worth noting that since the input terminals N1-N4 are connected in series, the lengths between the input terminals N1-N4 and the output terminal N0 are different. In other words, as the temperature of the memory circuit 120 changes, the length of the path through which the amplified strobe signal DQS' is transmitted from the differential amplifier OP to the data latches DL_1-DL_n will also change.

In some embodiments, the path-length-compensation circuit DQSP further comprises a plurality of signal redrivers RD. The signal redrivers RD are respectively arranged between the input terminals N1-N4 of the path-length-compensation circuit DQSP and connected in series, and are configured to enhance the amplitude of the output of the switch circuits SW1-SW4, so as to reduce the amplitude attenuation of the signal due to long-distance transmission.

In some embodiments, the length of each data path (not shown in FIG. 1) between the controller chip 110 and the data latches is less than the sum of the length of the path-length-compensation circuit DQSP and the length of the path between the signal buffer SB and any of the switch circuit SW1-SW4.

Since the delay of the circuit varies with the circuit temperature, in order to avoid the situation that the time when the data signal DQ and the amplified strobe signal DQS' are transmitted to the data latches DL_1-DL_n are not synchronized, the transmission path of the amplified strobe signal DQS' needs to change with the circuit temperature. In other words, the temperature control signals T1-T4 need to be switched to the high level corresponding to different circuit temperatures.

Take the embodiment in FIG. 1 as an example, when the temperature of the memory circuit 120 is high, the delay of signal transmission will increase, thus it is necessary to reduce the length of the transmission path of the amplified strobe signal DQS'. At this time, the temperature sensor TSEN switches the temperature control signal T1 to the high level, and keeps the temperature control signals T2-T4 in the low level to conduct the switch circuit SW1, so that the amplified strobe signal DQS' is able to be transmitted through a shorter path to data latches DL_1-DL_n. On the contrary, when the temperature of the memory circuit 120 is low, the delay of signal transmission will decrease, thus it is necessary to increase the length of the transmission path of the amplified strobe signal DQS'. At this time, the temperature sensor TSEN switches the temperature control signal T4 to the high level, and keeps the temperature control signals T1-T3 in the low level to conduct the switch circuit SW4, so that the amplified strobe signal DQS' is able to be transmitted through a longer path to data latches DL_1-DL_n.

In some unillustrated embodiments, the inverted signal buffer SBb and the differential amplifier OP in FIG. 1 can be omitted. At this time, the switch circuits SW1-SW4 are directly coupled to the signal buffer SB, and the strobe signal DQS is used as the output of the switch circuits SW1-SW4. In addition, at this time, the path-length-compensation circuit DQSP is configured to enhance the amplitude of the strobe signal DQS, and the strobe signal DQS is used as the output of the path-length-compensation circuit DQSP.

Figure 3:
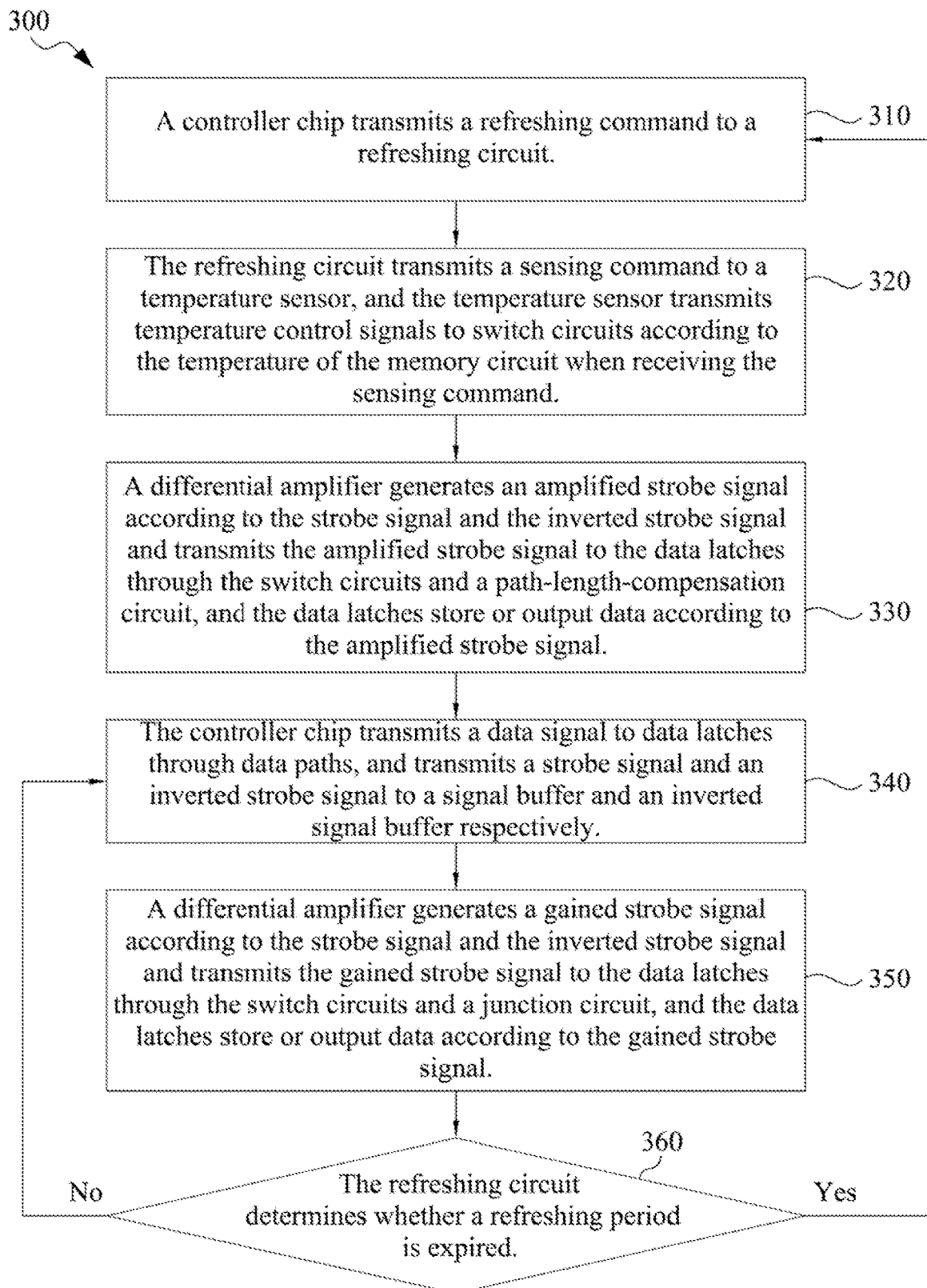
FIG. 3 is a flowchart of signal transmission method in accordance with some embodiments of the present disclosure.

FIG. 3 is a flowchart of signal transmission method 300 in accordance with some embodiments of the present disclosure. In some embodiments, the signal transmission method 300 comprises steps 310-360.

In step 310, the controller chip 110 transmits the refreshing command RFCM to the refreshing circuit RF for circuit delay correction.

In step 320, the refreshing circuit RF transmits the sensing command SEN to the temperature sensor TSEN in response to receiving the refreshing command RFCM, and the temperature sensor TSEN transmits the temperature control signals T1-T4 to the switch circuits SW1-SW4 respectively according to the temperature of the memory circuit 120 when receiving the sensing command SEN.

In step 330, the switch circuits SW1-SW4 are conducted or turned off according to the temperature control signals T1-T4 respectively.

In step 340, the controller chip 110 transmits the data signal DQ to the data latches DL_1-DL_n through the data paths, and transmits the strobe signal DQS and the inverted strobe signal DQSb to the signal buffer SB and the inverted signal buffer SBb respectively.

In step 350, the differential amplifier OP generates an amplified strobe signal DQS' according to the strobe signal DQS and the inverted strobe signal DQSb and transmits the amplified strobe signal DQS' to the data latches DL_1-DL_n through the switch circuits SW1-SW4 and the path-length-compensation circuit DQSP, and the data latches DL_1-DL_n store or output data according to the amplified strobe signal DQS'.

In step 360, the refreshing circuit RF determines whether the refreshing period RT is expired. In the situation that the refreshing period RT is expired, step 310 is performed again to transmit the refreshing command RFCM to the refreshing circuit RF by the controller chip 110 again. In the situation that the refreshing period RT is not expired, step 340 will be performed again, so that the controller chip 110 continues to transmit the data signal DQ, the strobe signal DQS and the inverted strobe signal DQSb to the memory circuit 120.

It should be noted that the quantity of the switch circuits, temperature control signals and input terminals in present disclosure are only examples, and are not intended to limit the present disclosure. The other quantity of the switch circuits, temperature control signals and input terminals are within the scope of the present disclosure.

With the memory circuit 120, signal transmission system 100 and signal transmission method 300 disclosed in present disclosure, the length of the transmission path of the amplified strobe signal DQS' can be regularly and automatically corrected according to the temperature of the memory circuit 120, which helps avoiding the asynchrony between the data signal DQ and the amplified strobe signal DQS', and also reduces bandwidth utilization. In addition, since the switch circuits SW1-SW4 can be implemented with simple MOS circuits, compared with the previous method which adds an oscillator circuit, it can cause smaller additional power consumption.

As used herein, the term "and/or" includes any combination of one or more of the mentioned elements. Unless otherwise specified in the description, any term in the singular also includes the meaning in the plural.

The above are preferred embodiments of the present disclosure, and various modifications and equivalent changes may be made to the structure of the present disclosure without departing from the scope or spirit of the present disclosure. In view of the foregoing, it is intended that the present disclosure cover modifications and variations of this invention provided they fall within the scope of the following claims.

What is claimed is:

1. A memory circuit, comprising:
    a signal buffer, configured to receive a strobe signal;
    a plurality of switch circuits, configured to be coupled to the signal buffer through a plurality of signal paths respectively, wherein the lengths of the plurality of signal paths are equal;
    a temperature sensor, coupled to the plurality of switch circuits and configured to conduct one of the plurality of switch circuits according to the temperature of the memory circuit in response to receiving a sensing command;
    a path-length-compensation circuit, comprising a plurality of input terminals connected in series, wherein the plurality of input terminals are configured to respectively receive the outputs of the plurality of switch circuits; and
    at least one data latch, coupled to an output terminal of the path-length-compensation circuit and configured to store or output data according to the output of the path-length-compensation circuit,
    wherein in response to the temperature of the memory circuit exceeding a first temperature threshold, the temperature sensor conducts a first switch circuit of the plurality of switch circuits,
    wherein in response to the temperature of the memory circuit exceeding a second temperature threshold, the temperature sensor conducts a second switch circuit of the plurality of switch circuits, wherein the first temperature threshold is higher than the second temperature threshold, and
    wherein the first switch circuit and the second switch circuit are respectively coupled to a first input terminal and a second input terminal of the plurality of input terminals, and the first input terminal is coupled between the at least one data latch and the second input terminal.

2. The memory circuit of claim 1, further comprising:
    an inverted signal buffer, configured to receive an inverted strobe signal, wherein the phases of the inverted strobe signal and the strobe signal are inverted; and
    a differential amplifier, wherein an output terminal of the differential amplifier is coupled to the plurality of signal paths, two input terminals of the differential amplifier are respectively coupled to the signal buffer and the inverted signal buffer, and the differential amplifier is configured to generate an amplified strobe signal according to the strobe signal and the inverted strobe signal,
    wherein the amplified strobe signal is transmitted to the path-length-compensation circuit through the plurality of switch circuits, and the path-length-compensation circuit uses the amplified strobe signal as the output of the path-length-compensation circuit.

3. The memory circuit of claim 1, wherein the path-length-compensation circuit further comprises:
    a plurality of signal redrivers, coupled in series and configured to enhance the outputs of the plurality of switch circuits, wherein the plurality of signal redrivers are respectively arranged between adjacent two of the plurality of input terminals.

4. The memory circuit of claim 1, further comprising:
    a refreshing circuit, coupled to the temperature sensor and configured to generate the sensing command at intervals of a refreshing period.

5. The memory circuit of claim 4, wherein the refreshing circuit is further configured to generate the sensing command in response to receiving a refreshing command.

6. The memory circuit of claim 1, wherein the at least one data latch is further configured to receive a data signal through at least one data path respectively, and length of the at least one data path is less than the sum of the length of the path-length-compensation circuit and the length of any one of the plurality of signal paths.

7. A signal transmission system, comprising:
    a controller chip, configured to transmit a data signal and a strobe signal; and
    a memory circuit, configured to be coupled to the controller chip and comprises:
    a signal buffer, configured to receive the strobe signal;
    a plurality of switch circuits, configured to be coupled to the signal buffer through a plurality of signal paths respectively, wherein the lengths of the plurality of signal paths are equal;
    a temperature sensor, coupled to the plurality of switch circuits and configured to conduct one of the plurality of switch circuits according to the temperature of the memory circuit in response to receiving a sensing command;
    a path-length-compensation circuit, comprising a plurality of input terminals connected in series, wherein the plurality of input terminals are configured to respectively receive the outputs of the plurality of switch circuits; and
    at least one data latch, coupled to an output terminal of the path-length-compensation circuit and configured to store or output data according to the output of the path-length-compensation circuit,
    wherein in response to the temperature of the memory circuit exceeding a first temperature threshold, the temperature sensor conducts a first switch circuit of the plurality of switch circuits,
    wherein in response to the temperature of the memory circuit exceeding a second temperature threshold, the temperature sensor conducts a second switch circuit of the plurality of switch circuits, wherein the first temperature threshold is higher than the second temperature threshold, and
    wherein the first switch circuit and the second switch circuit are respectively coupled to a first input terminal and a second input terminal of the plurality of input terminals, and the first input terminal is coupled between the at least one data latch and the second input terminal.

8. The signal transmission system of claim 7, wherein the memory circuit further comprises:
    an inverted signal buffer, configured to receive an inverted strobe signal, wherein the phases of the inverted strobe signal and the strobe signal are inverted; and a differential amplifier, wherein an output terminal of the differential amplifier is coupled to the plurality of signal paths, two input terminals of the differential amplifier are respectively coupled to the signal buffer and the inverted signal buffer, and the differential amplifier is configured to generate an amplified strobe signal according to the strobe signal and the inverted strobe signal, wherein the amplified strobe signal is transmitted to the path-length-compensation circuit through the plurality of switch circuits, and the path-length-compensation circuit uses the amplified strobe signal as the output of the path-length-compensation circuit.

9. The signal transmission system of claim 7, wherein the path-length-compensation circuit further comprises:

a plurality of signal redrivers, coupled in series and configured to enhance the outputs of the plurality of switch circuits, wherein the plurality of signal redrivers are respectively arranged between adjacent two of the plurality of input terminals.

10. The signal transmission system of claim 7, wherein the memory circuit further comprises:

a refreshing circuit, coupled to the temperature sensor and configured to generate the sensing command at intervals of a refreshing period.

11. The signal transmission system of claim 10, wherein the refreshing circuit is further configured to generate the sensing command in response to receiving a refreshing command.

12. The signal transmission system of claim 7, wherein the at least one data latch is further configured to receive the data signal through at least one data path respectively, and the length of the at least one data path is less than the sum of the length of the path-length-compensation circuit and the length of any one of the plurality of signal paths.

13. A signal transmission method, suitable for a signal transmission system including a controller chip and a memory circuit, comprising:

conducting, by a temperature sensor of the memory circuit, one of a plurality of switch circuits of the memory circuit according to the temperature of the memory circuit, comprising:

conducting, by the temperature sensor, a first switch circuit of the plurality of switch circuits in response to the temperature of the memory circuit exceeding a first temperature threshold; and conducting, by the temperature sensor, a second switch circuit of the plurality of switch circuits in response to the temperature of the memory circuit exceeding a second temperature threshold, wherein the first temperature threshold is higher than the second temperature threshold;

transmitting, by the controller chip, a data signal through one of at least one data path to one of at least one data latch of the memory circuit and a strobe signal to a signal buffer of the memory circuit respectively;

receiving, by a path-length-compensation circuit of the memory circuit, the outputs of the plurality of switch circuits; and storing or outputting, by the one of the at least one data latch, data according to the output of the path-length-compensation circuit, wherein the plurality of switch circuits are coupled to the signal buffer through a plurality of signal paths respectively, the lengths of the plurality of signal paths are equal, the temperature sensor is coupled to the plurality of switch circuits, the path-length-compensation circuit comprises a plurality of input terminals connected in series, the plurality of input terminals are configured to respectively receive the outputs of the plurality of switch circuits, and the at least one data latch is coupled to an output terminal of the path-length-compensation circuit, and wherein the first switch circuit and the second switch circuit are respectively coupled to a first input terminal and a second input terminal of the plurality of input terminals, and the first input terminal is coupled between the at least one data latch and the second input terminal.

14. The signal transmission method of claim 13, further comprising:

transmitting, by the controller chip, an inverted strobe signal to an inverted signal buffer of the memory circuit;

transmitting, by the signal buffer and the inverted signal buffer respectively, the strobe signal and the inverted strobe signal to a differential amplifier of the memory circuit;

generating, by the differential amplifier, an amplified strobe signal according to the strobe signal and the inverted strobe signal; and transmitting, by the differential amplifier, the amplified strobe signal to the path-length-compensation circuit through the plurality of signal paths and the plurality of switch circuits, and the path-length-compensation circuit uses the amplified strobe signal as the output of the path-length-compensation circuit, wherein the phases of the inverted strobe signal and the strobe signal are inverted.

15. The signal transmission method of claim 13, further comprising:

enhancing, by a plurality of signal redrivers of the path-length-compensation circuit, the outputs of the plurality of switch circuits, wherein the plurality of signal redrivers are coupled in series and respectively arranged between adjacent two of the plurality of input terminals.

16. The signal transmission method of claim 13, wherein conducting, by the temperature sensor of the memory circuit, the one of the plurality of switch circuits of the memory circuit according to the temperature of the memory circuit comprises:

transmitting, by a refreshing circuit of the memory circuit, a sensing command to the temperature sensor according to a refreshing command, and the temperature sensor conducts the one of the plurality of switch circuits according to the temperature of the memory circuit in response to receiving the sensing command; and transmitting, by the refreshing circuit, the sensing command to the temperature sensor at intervals of a refreshing period, and the temperature sensor conducts the one of the plurality of switch circuits according to the temperature of the memory circuit in response to receiving the sensing command.

17. The signal transmission method of claim 13, wherein the length of the at least one data path is less than the sum of the length of the path-length-compensation circuit and the length of any one of the plurality of signal paths.

* * * * *